United States Patent

[11] 3,628,168

[72] Inventor Yoshio Kobayashi
Osaka, Japan
[21] Appl. No. 9,487
[22] Filed Feb. 9, 1970
[45] Patented Dec. 14, 1971
[73] Assignee Sharp Kabushiki Kaisha
Osaka, Japan
[32] Priority Feb. 15, 1969
[33] Japan
[31] 44/13827

[54] DIFFERENTIAL AMPLIFYING CIRCUIT
4 Claims, 8 Drawing Figs.

[52] U.S. Cl. .......... 330/69, 330/30 D
[51] Int. Cl. .......... H03f 21/00
[50] Field of Search .......... 330/30 D, 69

[56] References Cited
UNITED STATES PATENTS

| | | | |
|---|---|---|---|
| 2,432,826 | 12/1947 | Smith .......... | 330/69 X |
| 3,153,203 | 10/1964 | Sem-Jacobsen et al. .......... | 330/30 |
| 3,496,480 | 2/1970 | Singletary, Jr. .......... | 330/30 D |

*Primary Examiner*—Nathan Kaufman
*Attorney*—Flehr, Hohbach, Test, Albritton & Herbert ABSTRACT: A differential amplifier having a DC path and an AC path for signal with a common grounding resistor. The DC path having high-ressure elements which compensate the characteristic difference between the amplifier elements. The AC path being connected in parallel with the DC path and having very low impedance value at the high-signal frequencies to bypass the DC path. As a result, the differential amplifier is not affected by the difference of characteristics between the two amplifying elements and shows good sensitivity in the high-frequency region.

INVENTOR.
Yoshio Kobayashi
BY Flehr, Hohbach, Test, Albritton & Herbert
Attorneys INVENTOR.
Yoshio Kobayashi
BY Flehr, Hohbach, Test, Albritton & Herbert
Attorneys

DIFFERENTIAL AMPLIFYING CIRCUIT

BACKGROUND OF THE INVENTION

This invention relates to differential amplifying circuits which serve to amplify AC signals and are used for electronic apparatus such as stereo units, radio receivers, television receivers, etc., and more particularly for intermediate frequency amplifying circuits of radio receivers.

Most differential amplifying circuits comprise generally two amplifying elements such as transistors and vacuum tubes. These two amplifying elements, as is well known, in the case of transistors must have substantially the same forward short circuit current amplification factor ($h_{FE}$), base-emitter voltage ($V_{BE}$) and other characteristics for optimum operation of the amplifier. This requirement can be substantially satisfied by monolithic integrated circuits which are manufactured at the same time on a silicon chip. Amplifying elements, however, such as discrete junction transistors, field effect transistors and vacuum tubes which are manufactured one by one, show a slight difference in characteristics even if they are manufactured in the same process. For this reason, if these elements are combined without selection, balance cannot be achieved in the differential amplifying circuit. The selection of matching elements is time consuming and expensive.

Unless the amplifying elements are matched, variations of reverse emitter opened circuit collector current or collector cutoff current ($I_{CO}$), current amplification factor ($h_{FE}$) and collector power source voltage are not compensated for and essential advantages of differential amplifying circuits cannot be sufficiently obtained. As described, monolithic integrated circuits have properties desirable for differential amplifying circuits. However, these integrated circuits are too expensive for use in radio receivers whose low price is strongly desired.

OBJECTS AND SUMMARY OF THE INVENTION

It is, accordingly, a primary object of this invention to provide a circuit which enables a stable performance such as obtained with matched elements, by using conventional junction transistors, field effect transistors, tubes, etc., which can be obtained for a very low price.

It is another object of this invention to obtain an unsaturated-type amplifying circuit in which transistors do not perform in the saturated range in case of the amplifying of high amplitude signals.

It is yet another object of this invention to provide differential amplifying circuits which are simple and inexpensive.

In brief, the principles and objects of this invention are embodied in a differential amplifying circuit which comprises at least two amplifying elements, a signal path for said amplifying elements including a path for the DC component of the signal and a path for the AC components of the signal formed separately with each other, with DC attenuator means interposed in said DC path, and bypassing means having much lower impedance than said attenuator for the AC component of signal interposed in said path for the AC component whereby performing with low sensitivity for said amplifying elements having different characteristics and with high sensitivity for AC signal.

In order to achieve the primary object, this invention allows the circuit to perform with low sensitivity for the difference in characteristics of amplifying elements and perform with high sensitivity for signals. That is, since the difference in characteristics of amplifying elements appears as a difference in DC potential, this invention allows the circuit to perform with low sensitivity so that the difference in characteristics may not affect the performance of differential amplifying circuit.

The differential amplifying circuit of this invention is composed to form a path for the DC component of signal and a path for the AC signal separately on part of the path for signal, so that only the DC component is attenuated and DC performance point is stabilized. This circuit reduces the differential performance for the DC component and causes the customary differential performance for the AC component.

For a better understanding of this invention, together with other and further objects thereof, reference is made to the following description taken in connection with the accompanying drawings.

DESCRIPTION OF THE PREFERRED EMBODIMENTS

Figure 1:
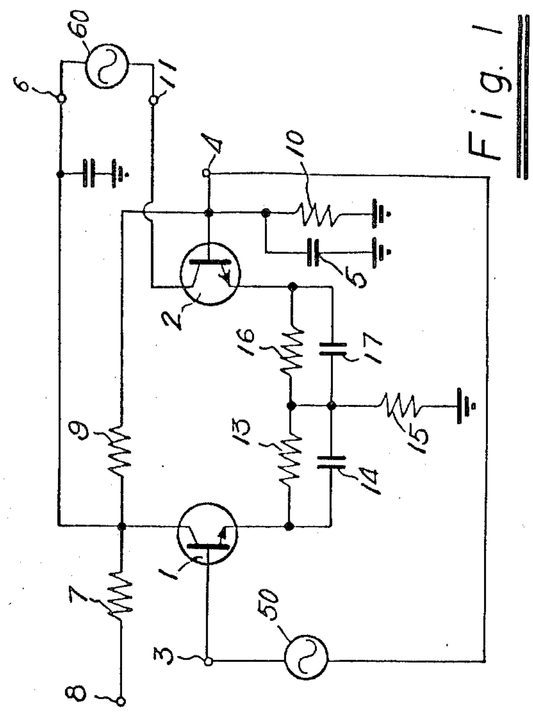
FIG. 1 is a circuit diagram illustrating a fundamental differential amplifying circuit according to this invention.

Referring to the circuit of a differential amplifier circuit in accordance with the invention shown in FIG. 1, the bases of NPN-type transistors 1 and 2 are connected with input terminals 3 and 4. The input signal is applied between input terminals 3 and 4 and is schematically shown as source 50. The base of transistor 2 is substantially grounded for AC signal by capacitor 5. The collector of transistor 1 is connected with output terminal 6 and also with electric power source terminal 8 of positive potential through resistor 7. The base of transistor 2 is connected with the low potential side of resistor 7 by resistor 9 and the ground through resistor 10. This circuit arrangement provides the base of transistor 2 with a bias voltage equal to voltage appearing at the common terminal of resistors 9 and 10. The collector of transistor 2 is connected with output terminal 11. The output signal appearing between output terminals 6 and 11 is represented at 60. The emitter of transistor 1 is connected with emitter resistor 15, which is common to transistor 2, through the parallel circuit of resistor 13 and capacitor 14 which shows much lower impedance for the frequency of AC signal than the resistor 13. Therefore, the DC component of signal passes through resistor 13 and AC signal passes through low impedance capacitor 14. The emitter of transistor 2, same as mentioned above, is also connected with the parallel circuit of resistor 16 and capacitor 17. The higher the value of resistors 13 and 16 is in comparison to the AC impedance of capacitors 14 and 17, the more pronounced is the performance and effect of this invention.

The fundamental differential amplifying circuit of this invention is constructed as above mentioned and when input signal 50 shows no amplitude and input terminals 3 and 4 show the same potential, there is no potential difference between output terminals 6 and 11. When there is a potential difference between input terminals 3 and 4, this difference is differentially amplified and appears between output terminals 6 and 11.

The DC component of emitter current of transistor 1 is grounded through resistor 13 by emitter resistor 15 and the AC signal is grounded through capacitor 14 of low impedance and resistor 15. The DC component of emitter current of transistor 2 is grounded through resistor 16 by emitter resistor 15 and AC signal is grounded through capacitor 17 and resistor 15. In this way, DC components of signals pass through resistor 13 or 16 and are grounded by emitter resistor 15, and the AC signal passes through low impedance capacitor 14 or 17. For this reason, only the DC components of signals are attenuated by resistor 13 or 16 and this attenuation has no effect on the other transistor and stabilizes the collector current of each transistor as differential amplifying performance for DC is reduced.

Figure 2:
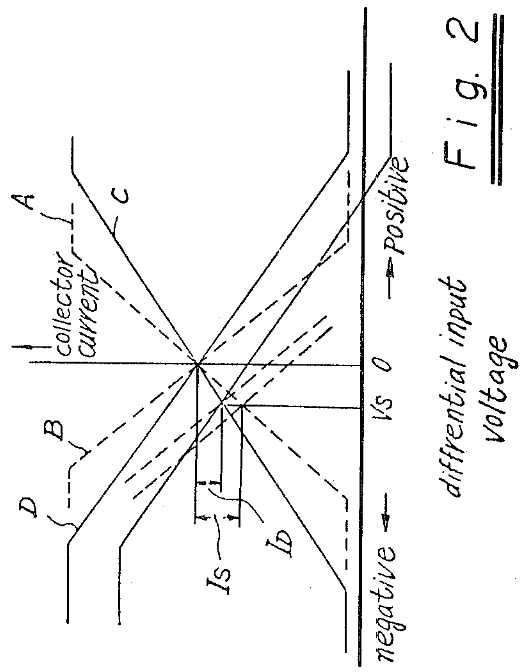
FIG. 2 is an explanatory diagram illustrating the performance of the circuit as shown in FIG. 1.

FIG. 2 illustrates the performance of the fundamental circuit shown in FIG. 1. The axis of the abscissa shows a difference between the base potential of transistor 1 and that of transistor 2 (input signal potential) with the right side showing a positive and the left side negative difference. The axis of the ordinate shows collector current. As the input signal potential is gradually increased toward the positive side, the collector current of transistor 1 is gradually increased as shown by line A, while that of transistor 2 is decreased as shown by line B.

When input signal is further increased and transistor 2 is cut off, the collector current of transistor 1 reaches the maximum. When the input signal is increased beyond this point, the collector current becomes saturated and constant. When the input signal is increased toward the negative side, the above performances of transistors 1 and 2 are interchanged. Accordingly, AC signal performance curves of transistors 1 and 2 are shown by dash lines A and B. Since the DC component of signal is attenuated by resistors 13 and 16, shown by lines C and D, the DC performance curves C and D show a gentler slope than AC signal performance curves A and B.

If the characteristics of transistor 1 and those of transistor 2 are quite the same, the input signal potential in performance curves A, B, C and D cross each other at the axis of ordinate or zero differential voltage as shown in FIG. 2 and assume a complete symmetry on each side.

If, however, the characteristics of transistor 1 are different from those of transistor 2 and there is a difference in the base potential required to send the same emitter current, i.e. there exists offset voltage $V_S$, there arises a deflection toward the left or right. For example, if transistor 2 has a lower base voltage required to send collector current of the same amplitude than transistor 1, the intersecting point with the curve of transistor 2 moves leftwards to the point of offset voltage $V_S$. Since this moving is caused by the difference in DC characteristics, it is done along the DC performance curve C. If moving is done along the AC signal performance curve, collector current changes by $I_S$ from the intersecting point of OV. If, however, moving is done along the DC performance curve, the amount of change is $I_D$; the change for DC is smaller. Therefore, even if two transistors have characteristics somewhat different from each other, the balance of differential amplifying circuit shows only a smaller disturbance and it is possible to maintain stability of the AC performance point.

Figure 3:
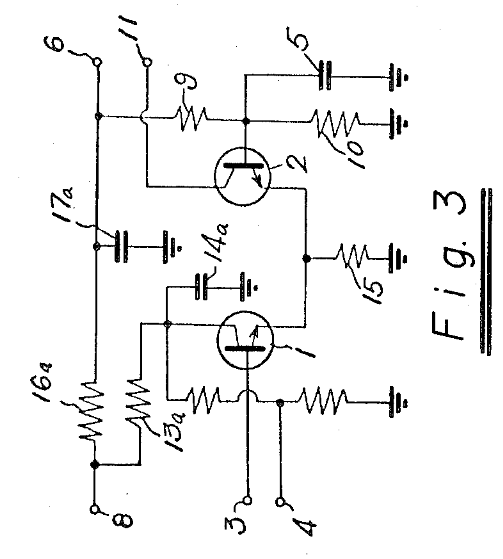
FIGS. 3–8 show several applied examples of the fundamental circuit of FIG. 1.

FIG. 3 shows an applied example of variations of said fundamental circuit of this invention; in this figure the part corresponding to FIG. 1 is shown by the same reference numerals. The circuit of FIG. 3 is characterized by the fact that resistors 13 and 16 and capacitors 14 and 17 of the circuit of FIG. 1 are inserted on the collector side of transistors 1 and 2 and are identified as 13*a* and 16*a*, and 14*a* and 17*a*, respectively.

Figure 4:
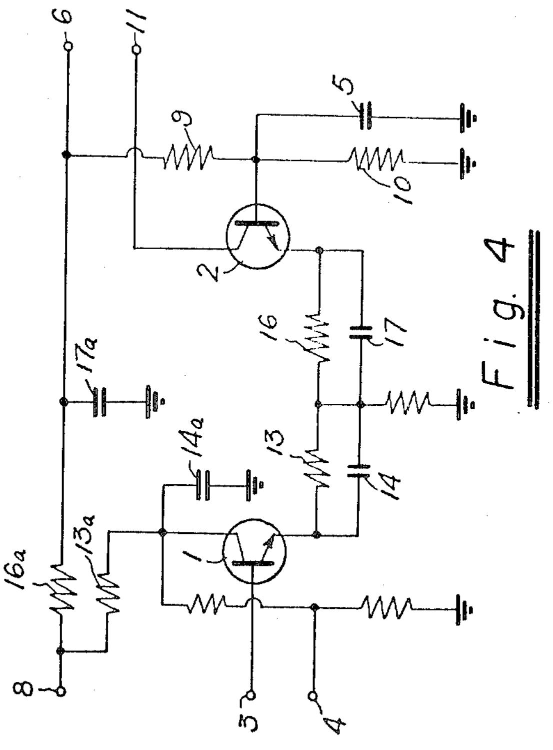

As shown in FIG. 4, another example of the embodiment is a combination of the circuit of FIG. 1 and that of FIG. 3 and is constructed by inserting the parallel circuit of resistor and capacitor both into the collector and the emitter of the transistor. Since this example makes it possible to increase the resistivity of DC circuit, stability of DC characteristics can be further increased and the performance of this invention becomes more pronounced.

Figure 5:
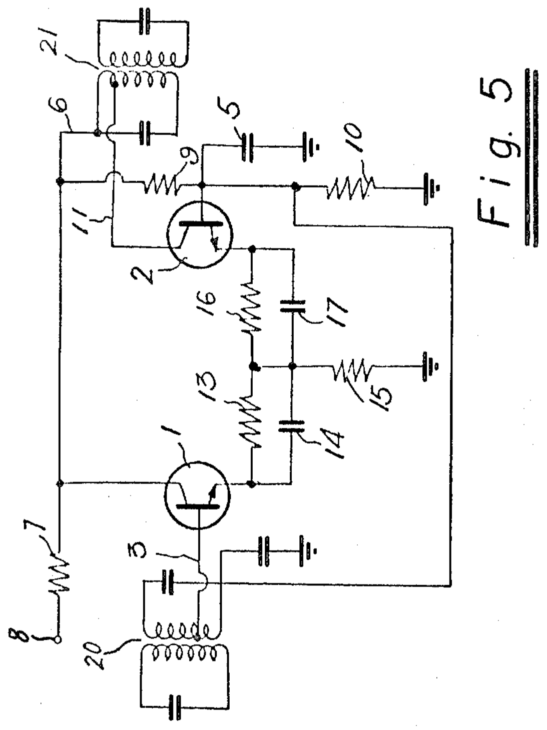

FIG. 5 shows a circuit in which this invention is applied to the intermediate frequency amplifying circuit of the FM receiver which has an amplitude limiting effect. The fundamental circuit of FIG. 1 is utilized between the input and output terminals of intermediate frequency transformers 20 and 21. In this figure the parts corresponding to FIG. 1 are designated by the same reference numerals.

Figures 6, 8:
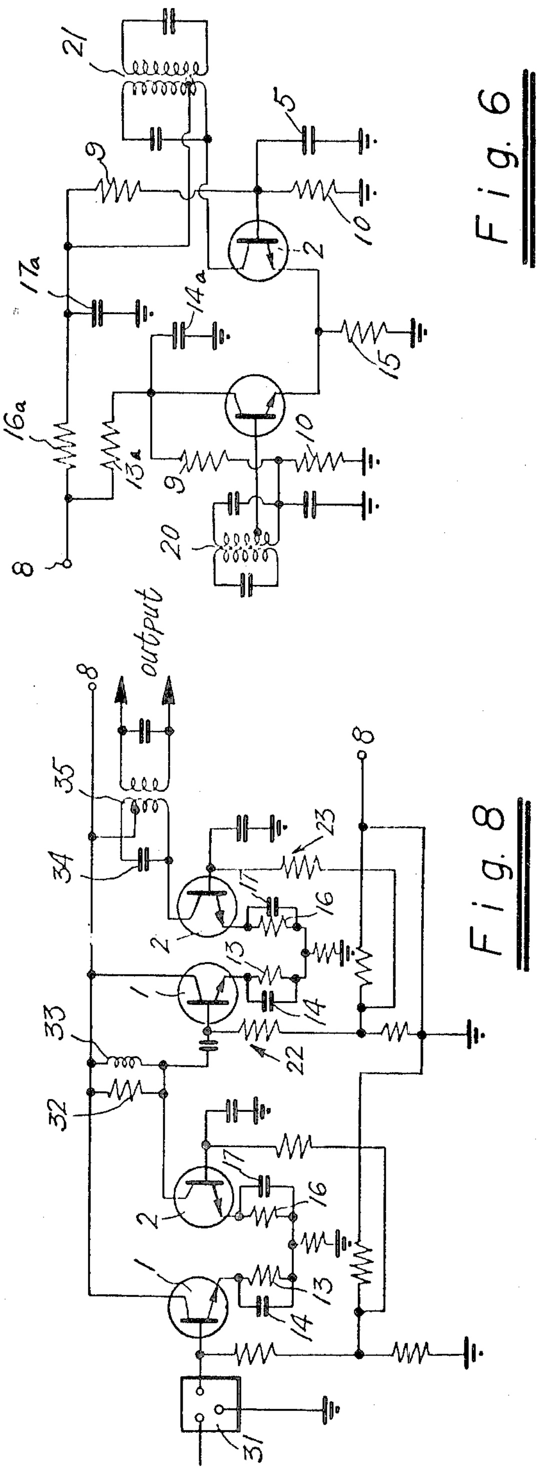

FIG. 6 shows a circuit in which the circuit of FIG. 3 is used as the intermediate frequency amplifier of an FM receiver. The circuit is connected between the intermediate frequency transformers 20 and 21.

Figure 7:
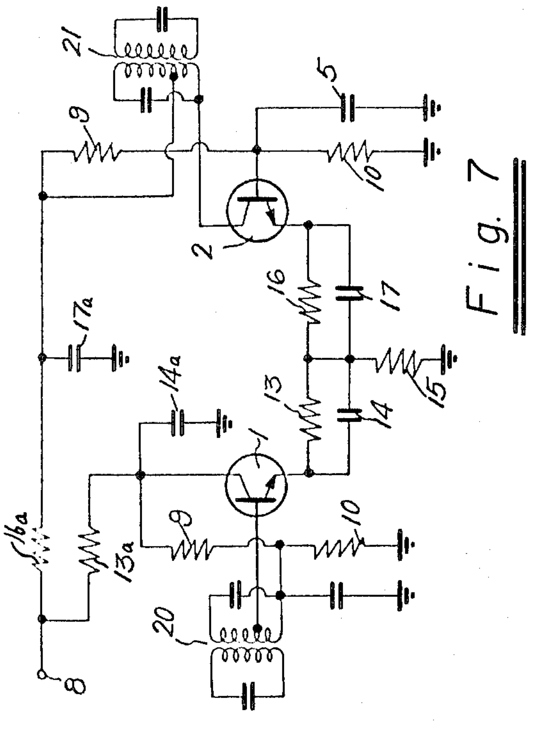

As shown in FIG. 7, it is possible to construct a circuit by combining the circuit of FIG. 5 with that of FIG. 6 and inserting the parallel circuit of resistor and capacitor both into the emitter and collector of the transistor. In this case DC stability can be further increased.

An amplifying circuit which can operate with large signals without saturation can be obtained. For example, in the circuits of FIGS. 5 and 6 when a large input signal is applied and the transistor 1 is brought to a cutoff state, bias may be applied to transistor 2 so that it does not saturate. The value of resistor 13 is chosen smaller than that of resistor 16 to give a little higher bias to the base of transistor 1. The voltage between base and emitter required to send constant collector current to transistor 1 is chosen lower than that for transistor 2, that is, the transistor having offset voltage $V_S$ is used. Because of this arrangement, the balance of transistors 1 and 2 is lost, but due to the parallel circuit of resistor and capacitor of this invention, variation of performance point is small. When a large input signal is applied and transistor 1 is in a cutoff state, transistor 2 is not brought to a saturated state so transistor 2 does not damp intermediate frequency transformer 21. Good results of the differential amplifying circuit such as signal selectivity, capture ratio, AM suppression, etc., are preserved.

FIG. 8 shows another embodiment of the invention showing an intermediate frequency amplifying circuit employing two stages of amplification. Like reference numerals are applied to like parts. Input terminals are connected to solid resonant-type filter 31. The output impedance of the first stage consists of parallel-connected resistor 32 and coil 33 and since this output impedance has no possibility of being damped by amplifying elements, the first stage is composed by a saturated-type differential amplifying circuit. The output impedance of the second stage is formed by the resonance circuit consisting of capacitor 34 and coil 35, and in order that this resonance circuit may not be damped, the second stage consists of the unsaturated-type differential amplifying circuit.

The foregoing disclosure and drawings are merely illustrative of the principles of this invention and are not to be interpreted in a limiting sense. The only limitations are to be determined from the scope of the appended claims.

I claim:

1. A differential amplifying unit comprising: two amplifying elements each having a pair of electrodes for carrying a current therebetween and an input control electrode for controlling such current; means for differentially applying an input signal to said control electrodes; output terminal means coupled to at least one of the pair of electrodes of each of said elements for providing an output signal having AC and DC components; first and second path means coupled respectively to one of said pair of electrodes of each of said elements for providing signal paths for said DC components including resistive means for attenuating said DC component; third and fourth path means coupled respectively to one of said pair of electrodes of each of said elements for providing signal paths for said AC components such path means respectively including a portion of said first and second path means but also including capacitive means for respectively bypassing said DC attenuating resistive means.

2. A differential amplifying unit as in claim 1 where said capacitive means are in parallel with said resistive means.

3. A differential amplifying unit as in claim 1 together with means for biasing said amplifying elements to keep one of said elements out of saturation even though the other of said elements is driven into a cutoff state by said input signal.

4. A differential amplifying unit as in claim 3 where said biasing is provided by unequal values of said resistive means.

* * * * *